(12) United States Patent
Nikolaev et al.

(10) Patent No.: US 8,368,012 B2
(45) Date of Patent: Feb. 5, 2013

(54) GUIDING CHARGED DROPLETS AND IONS IN AN ELECTROSPRAY ION SOURCE

(75) Inventors: Evgenij Nikolaev, Moscow (RU); Jochen Franzen, Bremen (DE)

(73) Assignee: Bruker Daltonik GmbH, Bremen (DE)

( * ) Notice: Subject to any disclaimer, the term of this patent is extended or adjusted under 35 U.S.C. 154(b) by 351 days.

(21) Appl. No.: 12/699,550

(22) Filed: Feb. 3, 2010

(65) Prior Publication Data

US 2010/0193679 A1   Aug. 5, 2010

(30) Foreign Application Priority Data

Feb. 3, 2009  (DE) .................. 10 2009 007 265

(51) Int. Cl.
*H01J 49/10* (2006.01)
*H01J 27/02* (2006.01)
*H01J 3/14* (2006.01)

(52) U.S. Cl. ..... 250/288; 250/281; 250/282; 250/423 R; 250/424; 315/111.81

(58) Field of Classification Search ............. 250/423 R, 250/424, 281, 282, 288; 315/111.81
See application file for complete search history.

(56) References Cited

U.S. PATENT DOCUMENTS

| 5,572,035 | A | 11/1996 | Franzen | |
|---|---|---|---|---|
| 6,906,322 | B2 * | 6/2005 | Berggren et al. | 250/288 |
| 6,943,347 | B1 | 9/2005 | Willoughby et al. | |
| 6,949,740 | B1 * | 9/2005 | Sheehan et al. | 250/288 |
| 7,312,444 | B1 | 12/2007 | Willougbhy et al. | |
| 7,335,877 | B1 | 2/2008 | Han et al. | |
| 7,465,940 | B2 * | 12/2008 | Franzen | 250/423 R |
| 7,518,108 | B2 * | 4/2009 | Frey et al. | 250/288 |
| 2008/0142698 | A1 | 6/2008 | Atherton et al. | |
| 2009/0057551 | A1 | 3/2009 | Tang et al. | |

OTHER PUBLICATIONS

GB Search Report.

* cited by examiner

*Primary Examiner* — Nikita Wells
(74) *Attorney, Agent, or Firm* — O'Shea Getz P.C.

(57) ABSTRACT

Charged spray droplets are guided in a pseudopotential distribution generated by audio frequency voltages at electrodes of a guiding device, focusing the spray droplets toward the axis. An axial electric field profile and an axial flow profile of a drying gas in the guiding device allow the drift of different-sized droplets to be controlled in the longitudinal direction of the guiding device, so that the droplets are roughly equal in size when they leave the guiding device and finally dry up shortly after leaving. As a result, the ions are formed in a relatively small spatial region. Electrostatic potentials guide the analyte ions from this small spatial region to the entrance aperture of the inlet capillary; during this process, very light ions, especially protons and water-proton complexes, can be filtered out by a mobility filter.

20 Claims, 4 Drawing Sheets

GUIDING CHARGED DROPLETS AND IONS IN AN ELECTROSPRAY ION SOURCE

PRIORITY INFORMATION

Figure 1:
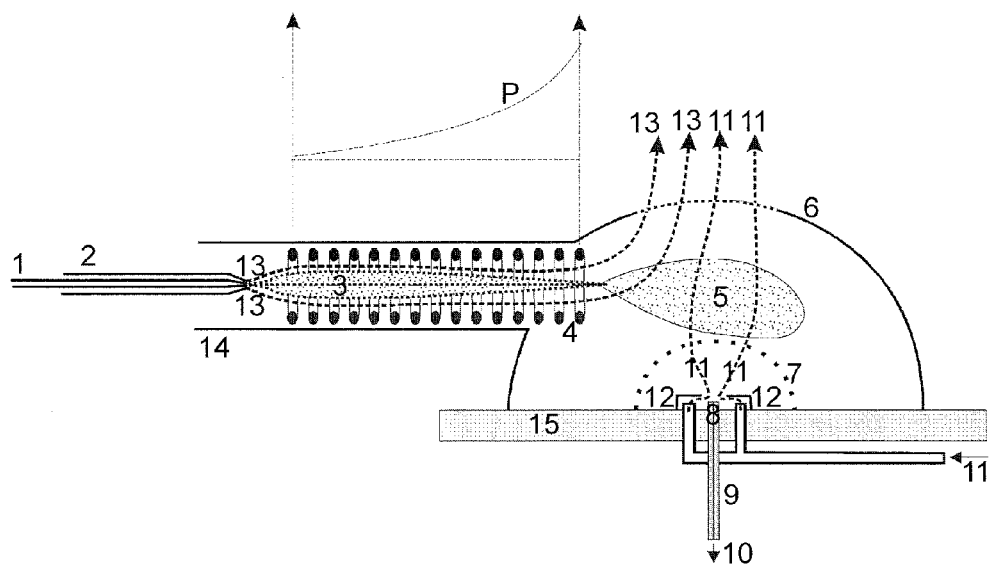

This patent application claims priority from German patent application 10 2009 007 265.9 filed on Feb. 3, 2009, which is hereby incorporated by reference.

FIELD OF THE INVENTION

The invention refers to the generation of ions in an electrospray ion source at ambient pressure, and to the introduction of the ions into an inlet capillary of an ion analyzer operated in high vacuum.

BACKGROUND OF THE INVENTION

The generation of ions of heavy analyte molecules with molecular weights of several hundred to many thousand daltons in an electrospray ion source is known. The ability to ionize macromolecules, which cannot be vaporized thermally, is extremely important. For example, in 2002, John Bennett Fenn was awarded a Nobel Prize for Chemistry for the development of the electrospray ion source toward the end of the 1980s.

A high voltage of several kilovolts is applied to a long, pointed spray capillary containing spray liquid with dissolved analyte molecules to generate an extremely strong electric field about the tip. This polarizes the surface of the spray liquid in the open tip and strongly charges it; the electrostatic pulling force fauns a so-called Taylor cone on the surface of the liquid, and the electric drawing field draws a fine jet of liquid out of the tip of the cone. This jet is intrinsically unstable due to its high surface charge, which opposes the surface tension. The jet disintegrates by constriction into minute, highly charged droplets with diameters in the order of one micrometer. Droplets with such a diameter carry about 50,000 elementary charges. The decomposition into droplets can be assisted by a sharp jet of a spray gas blown in around the tip of the capillary by a concentric spray gas capillary. This causes the jet of droplets to be guided in a somewhat more focused way, although the resulting droplets have greater diameter variance.

The droplets subsequently evaporate in a hot drying gas, a process whereby predominantly only neutral solvent molecules vaporize. This causes the charge density on the surface to continuously increase. When the density of the charges on the surface becomes so large that the Coulomb repulsion exceeds the force of the cohesive surface tension ("Rayleigh limit"), small droplets start to split off. The unstable surface brings about random deforming oscillations of the fluid on the surface, and these random motions, in turn, cause smaller droplets to separate off, causing the charges of both droplets to fall below the Rayleigh limit again. The smaller droplets which split off usually have a much higher charge in relation to their mass. This is possible because the total charge quantity q of a droplet at the Rayleigh limit is proportional to the root of the third power $\sqrt{d^3}=d^{1.5}$ of the diameter d. Split-off droplets can thus only carry away two percent of the mass, but fifteen percent of the charge, for example. However, the droplets generated, both large and small, have a mass-to-charge ratio above the Rayleigh limit, and can thus vaporize further.

All droplets, large and small, continue to vaporize, small droplets vaporizing faster and faster due to the fact that the coordination number of their surface molecules gets ever smaller, causing the vapor pressure to increase, until the splitting off and vaporization processes end relatively rapidly in a complete drying of a droplet, and multiply charged ions of the analyte molecules contained in the droplet remain. These analyte ions are generally only surrounded by a relatively strongly bound sheath of one to two molecular layers of polar solvent molecules, usually water.

The objective for any electrospray ion source is to draw in as many of these analyte ions as possible, together with hot drying gas into the inlet aperture of an ion analyzer operating in vacuum, for example a mass spectrometer or ion mobility spectrometer. Usually, the inlet aperture belongs to an inlet capillary. The analyte ions lose most of their solvate sheath on their way through the inlet capillary into the vacuum system, a process which is assisted by a heated drying gas and the decreasing pressure along the inlet capillary. In the ion analyzer, the analyte ions undergo the desired type of analysis. It is also possible to bundle several inlet capillaries in order to introduce the analyte ions into the vacuum; this bundle of inlet capillaries shall be included here when the term "inlet capillary" is used. On the other hand, an inlet capillary may be just a fine aperture.

The analyte ions generated by electro spraying are predominantly multiply charged; the number of charges for ions of a single substance varies greatly, however, and the average number of charges increases roughly in proportion to the mass of the analyte ions. The mass-to-charge ratios m/z (m=mass; z=number of excess elementary charges of the ion) have a broad distribution for heavy ions from about m/z=700 daltons up to about m/z=1,600 daltons, with a maximum at around m/z=1,200 daltons. Thus the heavy molecules of albumin (m=66 kDa) carry about 50 charges on average, while light molecules with molecular weights below m=1 kDa are predominantly singly charged. The distribution of the charges can be affected by the composition of the solvent, the spraying processes and the guidance of the ions through gases.

Since the droplets of the spray jet from the spray capillary are all highly charged, with 50,000 elementary charges per droplet, for example, they strongly repel each other. This causes the spray mist with the spray droplets, which are at first accelerated in the electric field, to broaden into a trumpet shape immediately after the droplets have been formed, at least in the case where no spray gas is applied. The space where the analyte ions are located after the liquid has vaporized from the droplets is thus extremely expanded. This spatial region will be called "ion formation space" below. It is difficult to draw a large number of analyte ions from a large spatial region into the inlet capillary.

A spray gas supplied in a sharp jet, which can be heated up to around 150° C., can be used to reduce the broadening of the spray mist, but the spray droplets are also accelerated. However, this produces an elongated ion formation space of moderate width, in which many fast, unvaporized droplets fly through the cloud of analyte ions. Since the inlet capillary must preferably not draw in any droplets, an additional problem involves keeping the droplets away from the entrance of the inlet capillary. This problem has led to the development of spray devices positioned orthogonally to the inlet capillary with spray gas blown in sharply to shoot the larger droplets way past the inlet capillary and into a waste aperture. This means that the analyte molecules in the larger droplets are lost to the analyses; the sensitivity of the method in principle is thus decreased.

The analyte ions produced in the greatly elongated ion formation space of moderate width, when spray gas is used, are extracted in the perpendicular direction and fed to the inlet capillary. This is successful for only a small portion of the analyte ions, because only analyte ions from a section of the length and width of this ion formation space reach the inlet capillary. More analyte ions can be extracted if the focusing of the ion formation space in the axial direction can be improved. This can be achieved by blowing in a "super hot" sheath gas at approx. 300° C. around the hot spray gas. The droplets are then "thermally focused"; the utilization of the analyte ions is better and the sensitivity of the method is greater.

SUMMARY OF THE INVENTION

Spray droplets are introduced in a focused manner into an ion for nation space in order to limit the radial expansion of this space. This is performed by focusing the highly charged droplets in the radial direction by pseudopotentials of a guiding device. The guiding device includes a multipole rod system, or a stack of diaphragms or the like, and thus resembles an RF guide system for ions in high and medium vacua, but is operated at a much higher pressure, for instance atmospheric pressure, and much lower frequencies, here at audio frequencies, for charged particles of relatively large mass. The guiding device for the droplets is also termed "droplet guide" below.

The frequency and amplitude of the alternating voltage in the droplet guide may be set so that heavier droplets with smaller m/z arrange themselves further away from the axis than light droplets and are forcibly subjected to a strong shaking movement by the alternating electric field and thus evaporate faster, and also decompose faster into smaller droplets due to the deformation thus caused. The vaporization of the droplets in the droplet guide can be assisted by infrared light. Very fast, unusually heavy droplets, which were accelerated by the spray gas, for example, can also be forced to burst by injecting them obliquely into the droplet guide or by a suitably shaped impact element at the entrance of the droplet guide.

Different mobilities of the differently sized spray droplets may be utilized in order to ensure that the complete drying of the droplets takes place in a small ion formation space with low axial expansion outside the droplet guide. This can be achieved by retaining larger droplets for longer times than smaller ones in the drying gas inside the droplet guide, using the different mobilities of differently sized droplets at the Rayleigh limit. The droplets retained longer in the droplet guide thus have more time to vaporize. This requires the generation of an axial electric field profile or axial pseudopotential distribution in the droplet guide which, in conjunction with direction and speed of the flow of a drying gas. Small droplets should be guided faster through the droplet guide, larger droplets, in contrast, more slowly or not at all. The spray droplets should not be allowed to finally evaporate until they have left the droplet guide in order that the analyte ions cannot be attracted by the electrodes to the point where they impact and are discharged.

Interfering light ions, especially solvent complexes with protons, may be filtered out to prevent them getting into the inlet capillary, which can take up only a limited amount of ions. The ion formation space is located within the attractive electric field of the inlet capillary, as usual. The attractive field can be formed by arrangements of electrodes so that all the ions migrate through the ambient gas to the entrance aperture of the capillary, for example. A bipolar grid with low-frequency alternating voltage can be interposed to act as a mobility filter and filter out the very mobile light ions, particularly the free protons, but also proton-water complexes and other protonated molecules or molecular complexes of the spray liquid, which should be prevented from entering the inlet capillary.

These and other objects, features and advantages of the present invention will become more apparent in light of the following detailed description of preferred embodiments thereof, as illustrated in the accompanying drawings.

BRIEF DESCRIPTION OF THE DRAWINGS

FIG. 1 is a schematic representation of an electrospray ion source with a spray device that is arranged orthogonally to the direction of the inlet capillary;

FIG. 2 illustrates a second embodiment of an electrospray ion source;

FIG. 3 illustrates a third embodiment of an electrospray ion source;

FIG. 4 illustrates a fourth embodiment of an electrospray ion source;

FIG. 5 illustrates a fifth embodiment of an electrospray ion source;

FIG. 6 illustrates a conical impact element in a funnel-shaped droplet guide 16, which. impact element causes larger droplets, which cannot escape with the spray gas flow, to burst on its surface; and FIG. 7 illustrates a hemispherical bipolar wire grid whose grid wires are mounted with insulation on an annular base plate, to filter out light ions by alternately applying the two phases of an alternating voltage to the grid wires.

DETAILED DESCRIPTION OF THE INVENTION

Different-sized droplets with charge densities at their respective Rayleigh limit have different mobilities $\mu=v/E$ ($v$=velocity) when they are pulled through gas by an electric field E. However, the quantitative relationship varies for different experimental conditions. For slow velocities v of the droplets without formation of turbulences, Stokes' law of friction applies, where the friction in the gas then is proportional to the diameter d and velocity v of a droplet, and the electrical mobility μ is then proportional to the square root of the diameter: $\mu\sim d^{1/2}$ Surprisingly, the mobility decreases as the droplets become smaller in this regime of low gas and droplet velocities. For high velocities v and in the presence of turbulences, Newton's law of friction is valid. The friction is proportional to the cross section $d^2$ and to the square $v^2$ of the velocity v. In this case, the mobility becomes reciprocally proportional to the fourth root $d^{1/4}$ of the diameter d: $\mu\sim d^{-1/4}$. In this regime, the mobility increases as the droplets become smaller. The friction regime depends on gas speed, droplet speed, and even audio voltage frequency and amplitude; the kind of friction regime valid in a special case has to be explored experimentally. In both regimes, however, it is possible to use the mobility of the droplets to retain larger droplets in droplet guides for longer times to make them evaporate stronger and longer.

FIG. 1 illustrates an embodiment for the case when larger droplets have a higher mobility (Stokes' law of friction). FIG. 1 is a schematic representation of an electrospray ion source with an audio frequency stacked ring droplet guide 4, the audio frequency field being superimposed by an axial DC potential profile P, presented in a schematic diagram with dashed lines above the droplet guide 4. For this arrangement it is assumed that larger droplets have a higher mobility (Stokes' law of friction). A jet 3 of fine droplets is drawn out of the spray capillary 1, assisted by a coaxial jet 13 of a hot spray gas from the spray gas capillary 2. Spray gas flow and temperature are chosen such that the droplets can be dried completely by this gas. The droplets are drawn by the spray gas flow 13 through the droplet guide 4, designed as a stack of ring electrodes, against the axial electric field generated by the potential distribution (P) presented in a schematic diagram with dashed lines above the droplet guide 4. The increasing axial electric field retains the larger droplets with higher mobilities until they have become, by evaporation and splitting, small enough to be released from the droplet guide 4 into the ion formation space 5 where they evaporate in the hot drying gas 11 to form analyte ions. DC voltages at hemispherical electrodes 6 and 7 and at inlet capillary cause the analyte ions to drift through the drying gas 11 to the entrance 8 of the inlet capillary, where they are drawn in together with a portion of the clean, hot drying gas 11 and transferred to the ion analyzer as an ion beam 10. The drying gas 11, which has a temperature of up to around 300° C., is introduced through a covering diaphragm 12 around the inlet capillary 8 into the interior of the hemispherical electrode 6 of the ion source. The electrodes 7 are arranged as a hemispherical bipolar grid so that, by applying a suitable alternating voltage, the light ions are filtered out by virtue of their high mobility and are prevented from reaching the input capillary 8. The audio frequencies may be about 20 to 2000 hertz, with amplitudes between about 20 and 2000 volts. The spray device is arranged orthogonally to the direction of the inlet capillary. The jet 3 of fine droplets is drawn out of the spray capillary 1, assisted by the coaxial jet 13 of a hot spray gas from the spray gas capillary 2. The amount of spray gas, its humidity and temperature are chosen such that the droplets can be dried almost completely by this gas. The droplets are driven by the spray gas flow 13 through the droplet guide 4 against the axial electric field generated by the potential distribution P. The increasing electric field retains the larger droplets with higher mobility until they have become, by evaporation and splitting, small enough to be released from the droplet guide 4 by blowing them over the electric field barrier. In this manner, all droplets leaving the droplet guide will have about the same small diameter as aimed at by this invention.

The droplets released from the droplet guide 4 are blown into the ion formation space 5 in front of the droplet guide 4, where they evaporate in the hot drying gas 11, forming analyte ions. DC voltages at the hemispherical electrodes 6 and 7 and at the inlet capillary 8 cause the freshly generated analyte ions to drift through the hot drying gas 11 to the entrance of the inlet capillary 6, where they are drawn in together with a portion of the clean hot drying gas 11 and introduced into the ion analyzer as the ion beam 10. The drying gas 11, which has a temperature of up to around 300° C., is introduced through an apertured cover 12 around the inlet capillary 8 into the space inside the hemispherical electrodes 6, 7. The electrodes 6, 7 are arranged as a hemispherical bipolar grid so that, by applying a suitable alternating voltage, the light ions may be filtered out by virtue of their high mobility and are prevented from reaching the input capillary 8.

Also the effect of the pseudo-forces on droplets of different size may be used to retain larger droplets for a longer time inside the droplet guide. For ions in vacuum, it is well-known that the pseudo-electrical force of an inhomogeneous field is based on their inertia. The phase of the forced oscillation of an ion in the RF field is shifted by 90° against the phase of the RF field itself: the RF field assumes its maximum (or minimum) when the ions reach their point of return and show zero velocity. In an inhomogeneous field, the electric force is different in both points of return, and the time-integrated force becomes a non-zero value: the pseudo-force. If the free oscillations of the ions are damped more by a gas, the pseudo-forces become smaller. For droplets in a gas at ambient pressure, this is quite different: droplets of high mass have a higher inertia and are less damped by the surrounding gas. Very small droplets can be completely damped within a period of the audio frequency and cannot build up a suitable phase shift. This has the effect that the pseudo-forces at atmospheric pressure are higher for larger droplets. For ions, after evaporation of the small droplets, there is no pseudo-force at all.

This effect is used in the embodiment shown in FIG. 2 which is similar to that of FIG. 1. For the arrangement of FIG. 2 it is assumed that the pseudo-electrical forces have a higher influence on larger droplets than on smaller ones. The jet 3 of fine droplets is blown by the coaxial spray gas jet 13 into an audio frequency multipole, in which the pole rods are arranged conically, generating an axial pseudo force. Here, the pseudo force field retains the larger droplets until they have become small enough to be blown against the pseudo-force out of the multipole into the ion formation space 5. Instead of the droplet guide 4 formed from stacked ring electrodes, a multipole rod system 16 is used. The rods are arranged in a conical form, producing a pseudo-field with an axial component, driving the charged droplets towards the wider end, against the stream 13 of spray gas. Because larger droplets are affected more by the pseudo-forces, they are retained longer in the multipole rod system. A quadrupole rod system, but also higher multipole rod systems may be used here. Also here, the audio frequencies may be adjusted between about 20 and 2000 hertz, with amplitudes between about 20 and 2000 volts.

For an operation in the regime of Newton's law of friction, the embodiment of FIG. 3 may be used. In the regime of Newton's law of friction, the arrangement of FIG. 3 may be used to retain larger droplets with lower mobility for evaporation. Here, the droplets are guided by an axial DC field, generated by DC potential profile (Q), within the stack of electrode rings, against the flow of drying gas 11. Large droplets with low mobility are retained until they become so small and high in mobility that they can be ejected even by the weak field at the end of the droplet guide against the flow 11 into the ion formation space 5. In this regime of friction, larger droplets have lower mobility than smaller droplets. To retain larger droplets with lower mobility for evaporation, the droplets are drawn by an axial DC field, generated by the DC potential profile (Q), through the stack of electrode rings, against the flow of drying gas 11. The closed electrode hemisphere 6 forces the drying gas 11 to flow into the droplet guide encountering the droplets. Large droplets with low mobility are retained until they became so small and high in mobility that they can be ejected even by the weak field at the end of the droplet guide against the flow 11 into the ion formation space 5.

Pseudopotentials are known to those skilled in the art of mass spectrometry from many applications in vacuum such as ion guides, linear and three-dimensional ion traps, collision cells and more. Pseudopotentials are not real potentials, but only an aid to a better understanding of the effect of inhomogeneous RF alternating fields on the ions. Pseudopotentials describe the effect of the electric forces of inhomogeneous alternating electric fields integrated over time. The pseudopotentials form pseudopotential wells within electrode arrangements such as multipole rod systems, Paul ion traps or the like, in which ions can be trapped. In a high vacuum, the ions oscillate in these potential wells; in a medium vacuum, their oscillations are damped by collisions with gas molecules and they collect in the minimum of the pseudopotential well.

Above about two kilopascals, the pseudopotentials cease to have an effect on the ions because the free mobility of the ions, which is necessary for the alternating fields to have an effect, is too impaired. For larger charged particles, however, an analogous effect of inhomogeneous alternating fields also occurs at higher pressures, albeit at much lower frequencies, which cause the particles to oscillate due to their mobility in the ambient gas and due to their inertia. The free mobility of these charged particles includes here in their mobility drift at lower alternating frequencies, with which they can almost freely oscillate in the alternating fields, building up a phase shift. The effect which alternating electric fields in the audio frequency range exert on particles and droplets in pressure ranges above two kilopascals can thus be described analogously by pseudopotentials. For the highly charged droplets in a droplet guide, there is a pseudopotential which has a minimum on the axis and increases radially outwards.

For ions in vacuum, the strength of the associated pseudo-force at a particular point of a pseudopotential is proportional to $z/m$, that is, the pseudopotential has a significantly weaker effect on large ions with large $m/z$ than on highly charged small ions. This is quite different for charged droplets at atmospheric pressure. Only droplets above a certain critical size can freely oscillate in a given audio frequency field. Above this size, the pseudo-forces decrease with $z/m$. But the pseudo-forces also decrease below this critical size because high friction and low inertia hinders the free oscillation. For smaller and smaller droplets, the effect of pseudo-forces decreases more and more and finally disappears; for the analyte ions generated by complete evaporation, there is no more pseudo-force. The droplet size for highest effect of the pseudo-forces depends on frequency and amplitude of the audio frequency voltage.

For droplets at the Rayleigh limit, the mass-to-charge ratio $m/z$ increases with the square root of the cube of the diameter $d$, i.e. with $d^{1.5}$. Droplets above the critical size therefore arrange themselves in the string-shaped elongated cloud in a droplet guide in such a way that the droplets with critical size are located on axis, while the heavier droplets with larger m/z, arrange themselves at the outside. This arrangement is advantageous because the outer droplets are forced to move in the rhythm of the alternating field existing there and are thus subjected to an additional motion in the drying gas, which leads to a stronger evaporation. The lower the frequency of the alternating voltage, the greater the shaking movement of these droplets; the preferred evaporation of larger droplets can thus be controlled to a certain extent by selecting the frequency.

It is highly favorable to adjust the critical size of the droplets to very small diameters, by setting the frequency and amplitude of the audio frequency voltage correspondingly. Droplets below the critical size should be ready for ejection from the droplet guide into the ion formation space 5.

The evaporation of the large droplets inside the droplet guide may be assisted by infrared radiation introduced axially from behind. This infrared radiation, from infrared lasers or infrared laser diodes, for example, may preferably even have a cross-sectional profile designed so that the droplets further out are irradiated more strongly than the droplets close to the axis. The frequency of the infrared radiation may be tailored to the solvent to achieve high absorption.

The shaking of the droplets in the regions of the droplet guide outside the axis leads not only to faster vaporization, but also to strong deformations of the droplets. These deformations disturb the spherical symmetry (point symmetry), thereby causing the formation of repulsive charge centers in the droplets, and hence instabilities and fast splitting.

The guiding or storage of charged particles in inhomogeneous alternating fields with audio frequencies at atmospheric pressure has been known for 50 years, and is used in many specialist fields, for example to determine the size of aerosol or dust particles.

Instead of the stack of ring diaphragms 4 in FIG. 1, any other arrangement of electrodes known as an ion guide can be used, e.g., multipole rod systems, double or multiple helices or stacks of apertured diaphragms with apertures of the same shape or different shapes. The different types of ion guides are known to those skilled in the art of mass spectroscopy. It is also known how axial electric potential profiles can be installed in the interior of the different types of guide system; these axial potential profiles can also be used in droplet guides.

In the droplet guide 4 of FIG. 1, which is constructed as a stack of ring diaphragms, an axial electric field is particularly easy to establish by adding increasing proportions of DC voltage to the alternating voltage from ring diaphragm to ring diaphragm. The axial field does not need to be constant; it is easy to generate any potential and field profile at the ring diaphragms, for instance the potential profile (P) in FIG. 1, or the profile (Q) in FIG. 3. The potential differences required are generally not large; for example, they are seldom more than a few volts.

The stack of ring diaphragms may also be supplied with the desired voltages in a completely different way to the one described above, however. For this, a stack of ring diaphragms with an uneven number of diaphragms may be used. An alternating voltage with only a single phase is applied to the even-numbered diaphragms, when the diaphragms are numbered consecutively, that is, the second, fourth diaphragm and so on. Conversely, only DC potentials are applied to the diaphragms with uneven numbers, including the first and last diaphragms. For the axial electric field, only the DC potentials on the uneven diaphragms are changed. This results in a relatively simple electric supply without the need to superimpose DC and AC voltages. In addition, the spray voltage at the tip of the spray electrode is affected little by the alternating voltage of the droplet guide because the spray DC voltage is applied between spray capillary and the first ring diaphragm.

Droplets vaporize faster the smaller they become because their vapor pressure increases as the coordination number of the surface molecules decreases. The last stage of the evaporation is therefore relatively quick. This stage of the total evaporation should not take place in the droplet guide because then the high mobility of the ions produced, which is many times higher than that of the droplets, would mean the ions are drawn to the electrodes of the droplet guide where they are discharged. By adjusting the parameters of the droplet guide including the gas flow correctly, the droplets can be guided in such a way that they leave the droplet guide before evaporation is complete. Moreover, an attracting voltage must quickly pull the droplets from the end of the droplet guide into the ion formation space 5. The attracting voltage at the end of the droplet guide results from the differences between the potentials of the electrodes of the droplet guide and the potentials at the electrodes 6 and 7, which are shown here as hemispheres. The final evaporation of the droplets, and thus the generation of the analyte ions, should take place in the ion formation space 5.

In the ion formation space 5, not only analyte ions are formed, but many excess charges are also released from the droplets, which usually form complex ions with the solvent molecules. In the case of positive analyte ions, they are mostly water-proton complexes, but also complexes of the protons with other solvent molecules. These complex ions should not be drawn into the inlet capillary 9 with the analyte ions because their space charge interferes with the transport of the analyte ions. The space charge is already high because of the large number of complex ions. The complex ions mostly have relatively small masses below about 100 daltons and much higher mobility than the analyte ions.

Figure 7:
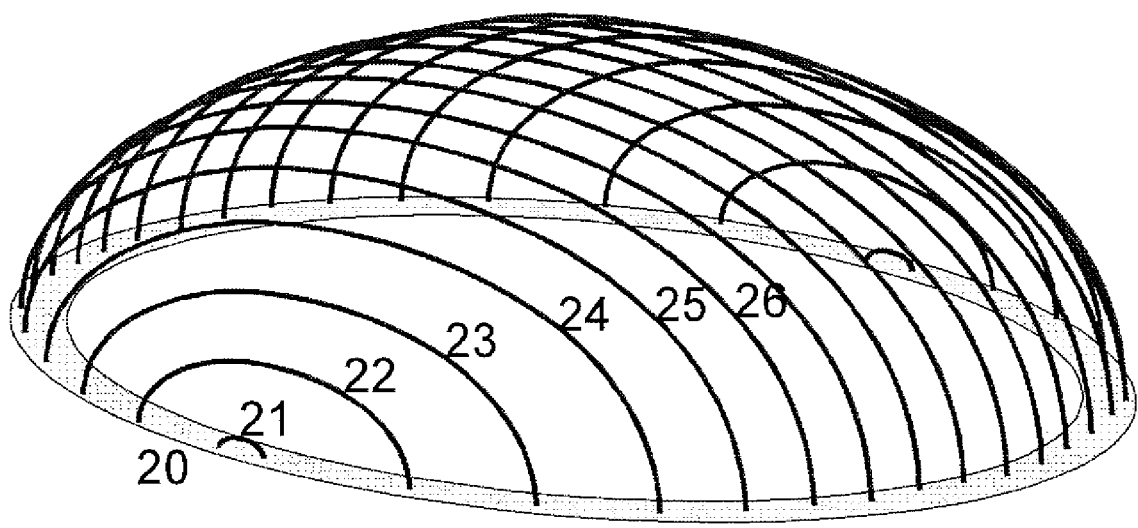

The high mobility of the complex ions can be used to filter out these ions. If the hemispherical grid electrode 7 is constructed as a bipolar grid, as is shown in FIG. 7, and if the grid wires (e.g., 21-26 etc.) of this bipolar grid 7 are alternately supplied with both phases of a low-frequency alternating voltage, ions of high mobility can no longer pass through this grid. If these highly mobile ions come close to the grid wires, they begin to migrate to and fro in the rhythm of the low-frequency alternating voltage to such an extent that they collide with the grid wires and are discharged. The lower mobility of large analyte ions, on the other hand, means that their mobility drift has such a small amplitude of motion in the low-frequency alternating field of the grid that they can drift though the grid and suffer only small losses.

The bipolar grid in FIG. 7 can be made, for example, from about 0.2 millimeter thin, steel wires (e.g., 21 to 26 etc.) insulated from each other and arranged in parallel with a separation of around one millimeter on an annular base plate 20. The steel wires form semicircles of different radii and together form the hemisphere 7 of FIGS. 1 to 5. The frequencies are preferably between about 20 and 5,000 hertz, the voltages preferably between about 2 and 200 volts.

Figure 2:
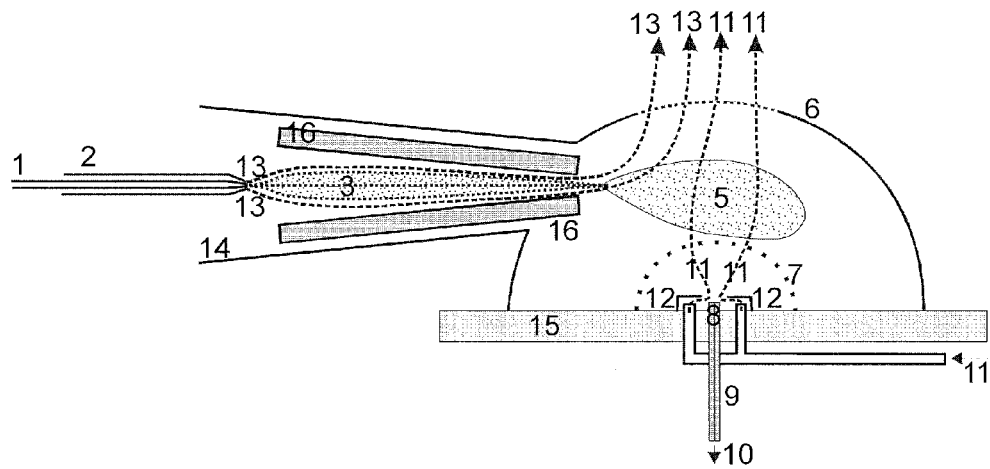
Figure 3:
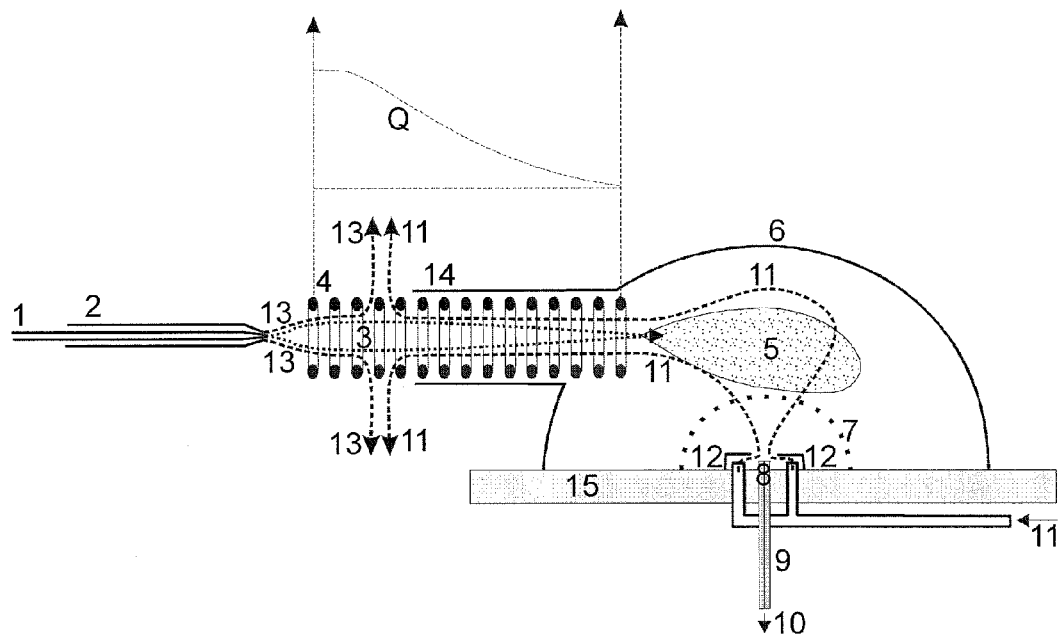

It is possible that the arrangement of the electrospray ion sources according to FIGS. 1 to 3 cannot bring all the analyte molecules as ions to the inlet capillary 9. Very large droplets may be accelerated in the spray gas jet so strongly that they fly undamped through the droplet guide 4. The use of a spray gas jet 13 often leads to the production of droplets with very unequal diameters.

Figure 6:
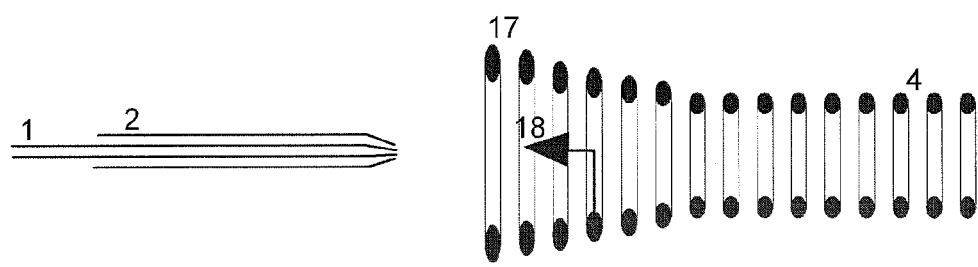

Very fast, unusually heavy droplets that were accelerated in this way by the spray gas can, however, be made to burst by injecting the spray jet obliquely into the droplet guide or by an impact element at the entrance of the droplet guide. The impact element can take the shape of an impact plate, for example, a zeppelin or a cone with a sharp point, around which the spray gas flows. FIG. 6 shows a conical impact element 18 in the funnel 17 of a funnel-shaped entrance of a droplet guide. The spray gas which flows around the impact element entrains the smaller, less inert droplets, so they do not touch the impact element; the larger droplets, however, hit the sloping sides and burst there. The impact element 18 can be made of a hydrophobic material such as polytetrafluoroethylene (PTFE). Due to the continuous impact of droplets, the impact element is self-cleaning. The rear part of the impact element can also be surrounded by an open impact cylinder (not shown), whose internal surface presents a further impact surface for the spray droplets, which bounce off, thus decelerating them further in the axial direction.

Figure 4:
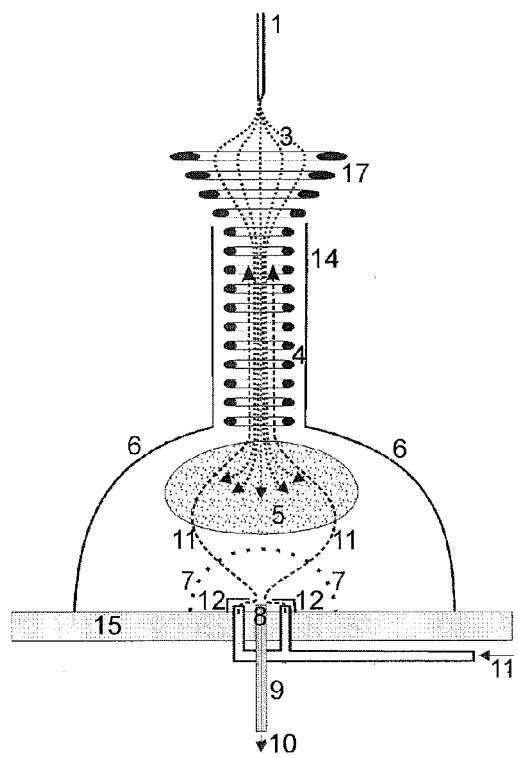

FIG. 4 illustrates yet another embodiment of an electrospray ion source which uses the capillary 1 for nanospraying, but without spray gas. The ion source is similar to the one in FIG. 3, but operates with nanospraying without spray gas, and uses a funnel-shaped droplet guide 16 with axial DC field to take up the rapidly broadening spray mist, which it forms into the spray jet 3. In contrast to FIG. 3, the spray capillary 1 here sprays in the direction toward the inlet capillary 8. The droplets are quickly decelerated in the spray mist of the nanospraying. The droplet jet 3 forms a mist that spreads quickly, but which includes small droplets with relatively uniform size when nanospraying. The diameters of the droplets are in the order of only about one hundred to several hundred nanometers. The mist droplets may have only very moderate velocities, which result from their mobility in the drawing field of the nanospraying. Since the strength of the drawing field decreases rapidly away from the capillary tip, the velocity of the mist droplets also decreases rapidly because they are decelerated relatively quickly in the ambient gas owing to their small size. The mist droplets are taken up by the droplet guide 4 whose entrance takes the form of a funnel 17. This funnel-shaped part of the droplet guide transfers the mist droplets through the ambient gas, which is largely stationary here, into the section of the droplet guide 4 with constant cross-section. Here the droplets can be guided with size-dependent speed by an axial electric field against the flow 11 of the drying gas until they leave the droplet guide 4 in the direction of the ion formation space 5 as very small droplets which are just before final vaporization, attracted by the potential of the grid electrode 7. After leaving the droplet guide 4, the droplets of the droplet jet 3 move apart again. As soon as the droplets have dried up, the usually highly charged analyte ions, which have much higher mobility than the droplets, migrate through the grid 7 toward the entrance aperture 8 of the inlet capillary 9.

The orthogonal arrangement of the spray capillary 1 and the inlet capillary 9 is no longer required precisely when the droplets in the ion formation space 5 vaporize almost completely. Since the nanospray device of FIG. 4 largely ensures this complete vaporization, a coaxial arrangement of the spray capillary 1 and the inlet capillary 9 can be selected without disadvantage. This arrangement represents an extreme, however; it can only be selected if there is some degree of certainty that no droplets remain unevaporated and no droplets fly at high speed through the droplet guide. The axes of the spray capillary 1 and the inlet capillary 9 can therefore also be preferably configured for the arrangement of FIG. 2 with a parallel offset so that residual droplets do not fly directly toward the inlet capillary 9. The spray capillary 1 can, however, also be arranged differently to FIG. 2, at any angle between zero and ninety degrees to the inlet capillary. In preferred embodiments, the spray capillary 1 does not aim directly toward the entrance aperture of the inlet capillary 9.

Figure 5:
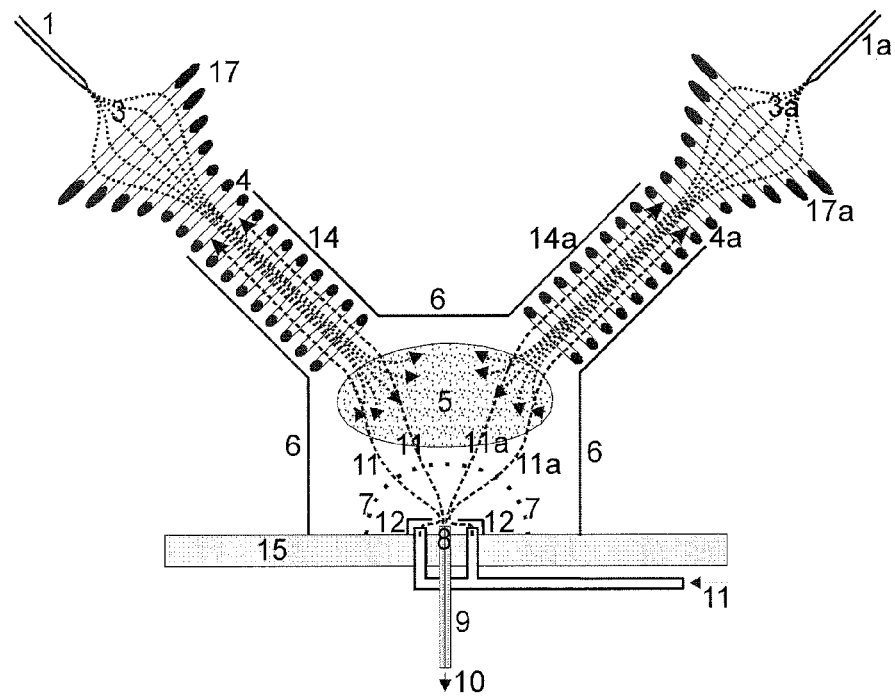

FIG. 5 shows an electrospray ion source where two spray capillaries 1 and 1a are each at an angle of 45° with respect to the inlet capillary 9, which produce two spray mist jets 3 and 3a, taken up by two funnel-shaped droplet guides 16 and 16a. The two electrospray arrangements may be operated either synchronously or alternately so that they generate analyte ions in the ion formation space 5. The two spray mist jets 3 and 3a are taken up by two funnel-shaped droplet guides 17 and 17a, which continue into the droplet guides 4 and 4a in the two guide tubes 14 and 14a, through which the now split drying gas streams 11 and 11a flow. Each of the two spray devices operates like the spray device shown in FIG. 2. The two spray devices shown in FIG. 3 can be operated either synchronously or alternately. In this double ion source, analyte ions and reference ions for the mass scale may be produced either consecutively or simultaneously, for example. In many cases, so-called "lock-in masses" are used to increase the mass accuracy; these masses serve as reference points for accurate mass determination in the mass spectra of the analyte ions. But it is also possible to use spray liquids with reference substances in order to determine the concentration of the analyte ions more precisely.

The electrospray ion sources may include more than two spray devices. For example, a mass spectrometer with a quadruple electrospray ion source can sample the eluents of four simultaneously connected liquid chromatographs and thus simultaneously acquire four chromatograms with corresponding mass spectra.

The spray capillary 1 and the diverse droplet guides in FIGS. 1 to 5 do not have to be arranged coaxially. It can be advantageous to inject the droplets outside the axis of the droplet guide in the arrangements of FIGS. 1 to 5. In particular, an oblique injection may be chosen so that large droplets that are too fast are made to hit the ring diaphragms and burst. This oblique injection of the droplets may be particularly advantageous when using a sharp jet of spray gas. The use of an impact element for the purpose of causing large droplets to burst has been described hereinabove.

In FIGS. 1 to 4, the outer electrode 6 and the grid electrode 7 are shaped as hemispheres. The hemispherical outer electrode 6 may even close off the space for the drying gas. The hemisphere 7 is constructed as a bipolar grid, through which the ions can drift. The hemispherical shape of the bipolar grid 7 is especially advantageous because it creates a field in the interior which makes the ions drift towards the entrance 8 of the inlet capillary 9. The outer electrode 6 can be a completely different shape, however, for example the shape of a box with flat walls, as is shown in the example of FIG. 5. Any form can be chosen which causes the ions to migrate to the hemispherical grid electrode 7. After passing through the bipolar, hemispherical grid 7, the ions drift quite accurately toward the entrance aperture 8 of the inlet capillary 9, and are collected by the suction cone of the drying gas 11 flowing into the entrance aperture 8 of the inlet capillary 9.

Although the present invention has been illustrated and described with respect to several preferred embodiments thereof, various changes, omissions and additions to the form and detail thereof, may be made therein, without departing from the spirit and scope of the invention.

What is claimed is:

1. A method for generating analyte ions in an electrospray ion source, comprising:
   spraying a liquid with dissolved analyte molecules in an ambient gas to form charged droplets; and
   applying a pseudopotential generated by an alternating voltage on electrodes of a droplet guiding device to axially focus the charged droplets; wherein the frequency and amplitude of the alternating voltage at the droplet guiding device are adjusted to collect the larger droplets of the droplet mixture.

2. The method of claim 1, wherein the electrodes of the droplet guiding device are designed as a multipole rod system, a double or multiple helix, a stack of apertured diaphragms or as a stack of apertured diaphragms with partially funnel-shaped interior.

3. The method of claim 1, wherein the pseudopotential is generated by alternating voltages in the range from about 20 to 20,000 hertz with voltages between about 20 and 2000 volts at the electrodes of the droplet guiding device.

4. The method of claim 1, wherein the spray droplets are sprayed in the direction of an impact element located in the entrance region of the droplet guiding device.

5. The method of claim 1, wherein an axial DC potential or pseudopotential profile and an axial gas flow profile is provided in the droplet guiding device.

6. The method of claim 5, wherein the profile of the axial potential and the profile of the axial gas flow velocity are adjusted to keep larger droplets for longer times than smaller droplets in the droplet guiding device.

7. The method of claim 6, wherein the profile of the axial potential and the profile of the axial gas flow velocity are adjusted to eject the droplets from the droplet guiding device with roughly the same diameter.

8. The method of claim 1, wherein the frequency and amplitude of the alternating voltage at the droplet guiding device are adjusted to collect the larger droplets of the droplet mixture outside the axis of the droplet guiding device, the larger droplets thus being subjected to a shaking motion, which causes them to vaporize faster and disintegrate faster than the smaller droplets, but without causing them to hit the electrodes of the droplet guiding device.

9. The method of claim 1, wherein the droplets in the droplet guiding device are irradiated with infrared light.

10. The method of claim 1, wherein the jet of droplets is injected into the droplet guiding device at an oblique angle to the axis.

11. The method of claim 1, wherein an arrangement of electric fields causes the analyte ions generated by the drying of the droplets to drift through the ambient gas to the entrance aperture of an inlet capillary, which introduces the analyte ions into the mass analyzer.

12. The method of claim 11, wherein a bipolar grid is located between the space where the ions are generated and the entrance aperture of the inlet capillary, and an alternating voltage applied to this bipolar grid filters out ions with a mobility above an adjustable mobility threshold as they drift through the grid.

13. The method of claim 12, wherein the frequency of the alternating voltage at the bipolar grid can be set to between about 50 and 5,000 hertz and the amplitude to between about 2 and 200 volts.

14. An electrospray ion source which generates charged droplets, comprising a droplet guiding device for the charged droplets that includes electrodes to which alternating voltages are supplied; wherein the frequency and amplitude of the alternating voltage at the droplet guiding device are adjusted to collect the larger droplets of the droplet mixture.

15. The electrospray ion source of claim 14, wherein the electrodes of the droplet guiding device are designed as a multipole rod system, a double or multiple helix, stacked ring electrodes or as a stack of apertured diaphragms with partially funnel-shaped interior.

16. The electrospray ion source of claim 14, comprising an alternating voltage generator which supplies an alternating voltage with a frequency of between about 20 and 20,000 hertz and an amplitude of between about 20 and 2,000 volts for the electrodes of the droplet guiding device.

17. The electrospray ion source of claim 14, wherein several spray capillaries and several droplet guiding devices are present.

18. An electrospray ion source comprising a spray capillary and an inlet capillary leading into the vacuum system of an ion analyzer, wherein a bipolar grid is located between the spray capillary and the inlet capillary, and the phases of an alternating voltage with a frequency of between about 50 and 5,000 hertz and an amplitude of between about 2 and 200 volts are applied alternately to the grid wires.

19. An electrospray ion source comprising a spray capillary for the generation of a jet of spray droplets in an ambient gas at atmospheric pressure, wherein an impact element is arranged in the jet of the spray droplets such that spray gas which flows around the impact element entrains smaller, less inert droplets so the less inert droplets do not contact the impact element, whereas larger droplets burst upon hitting the impact element.

20. The electrospray ion source of claim 19, wherein the impact element comprises hydrophobic material.

* * * * *

UNITED STATES PATENT AND TRADEMARK OFFICE
CERTIFICATE OF CORRECTION

| | | |
|---|---|---|
| PATENT NO. | : 8,368,012 B2 | Page 1 of 1 |
| APPLICATION NO. | : 12/699550 | |
| DATED | : February 5, 2013 | |
| INVENTOR(S) | : Nikolaev et al. | |

It is certified that error appears in the above-identified patent and that said Letters Patent is hereby corrected as shown below:

Column 1
Line 32, please delete "fauns" and insert --forms--

Column 3
Line 14, please delete "for nation" and insert --formation--

Signed and Sealed this
Second Day of April, 2013

Teresa Stanek Rea
*Acting Director of the United States Patent and Trademark Office*